United States Patent [19]

Worns

[11] Patent Number: 4,517,279
[45] Date of Patent: May 14, 1985

[54] PHOTOSENSITIVE ELASTOMERIC POLYMER COMPOSITION FOR FLEXOGRAPHIC PRINTING PLATES - PROCESSABLE IN SEMI-AQUEOUS BASIC SOLUTION OR SOLVENT SYSTEMS

[75] Inventor: John R. Worns, Mishawaka, Ind.

[73] Assignee: Uniroyal, Inc., Middlebury, Conn.

[21] Appl. No.: 634,732

[22] Filed: Jul. 26, 1984

Related U.S. Application Data

[63] Continuation of Ser. No. 413,581, Aug. 31, 1982, abandoned.

[51] Int. Cl.³ .............................................. G03C 1/68
[52] U.S. Cl. .................... 430/286; 430/281; 430/288
[58] Field of Search ............. 430/281, 286, 288, 905, 430/916; 204/159.15, 159.22

[56] References Cited

U.S. PATENT DOCUMENTS 3,787,212 1/1974 Heimsch et al. .................... 430/286
4,177,074 12/1979 Proskow ............................ 430/286
4,272,608 1/1981 Proskow ............................ 430/286

*Primary Examiner*—Jack P. Brammer
*Attorney, Agent, or Firm*—John A. Shedden

[57] ABSTRACT

A high molecular weight butadiene/acrylonitrile copolymer is used in a photosensitive composition containing the following:

(A) 40 to 90% by weight of the total composition of a high molecular weight butadiene/acrylonitrile carboxylated copolymer having a number average molecular weight of 30,000 to 125,000, an acrylonitrile content of 10 to 50%, and a carboxyl content of 1% to 15% by weight.

(B) 5 to 60% by weight of the total composition of a high molecular weight butadiene/acrylonitrile non-carboxylated copolymer having a number average molecular weight of 50,000 to 100,000, an acrylonitrile content of 10 to 30% so that the combination of the carboxylated and non carboxylated high molecular weight copolymers give a composition with a carboxyl content of 3 to 10%.

(C) 2 to 40% by weight of the total composition of an addition photopolymerizable ethylenically unsaturated monomer and (D) 0.1 to 10% by weight of the total composition of a photoinitiator activatable by actinic radiation.

7 Claims, 2 Drawing Figures

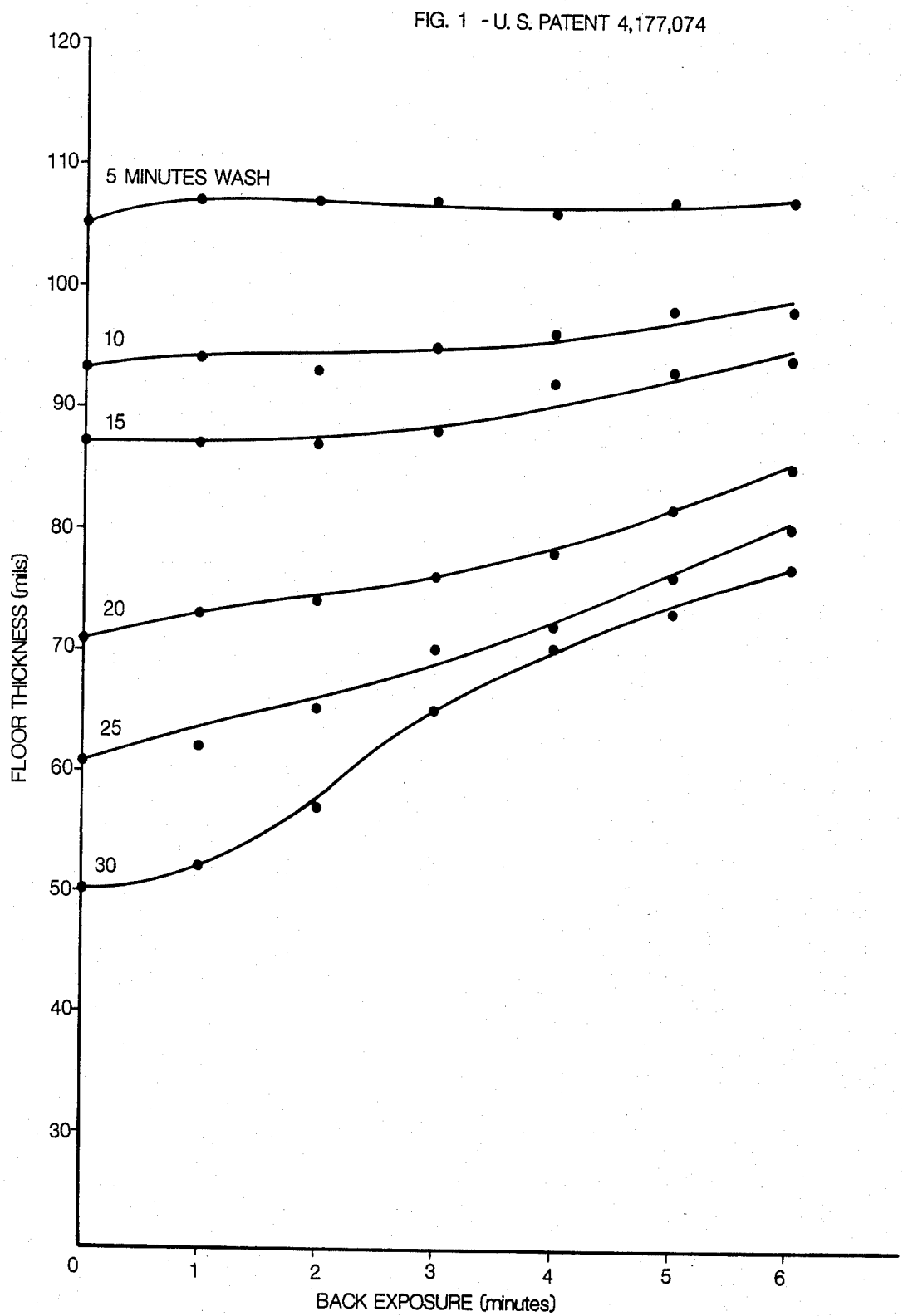

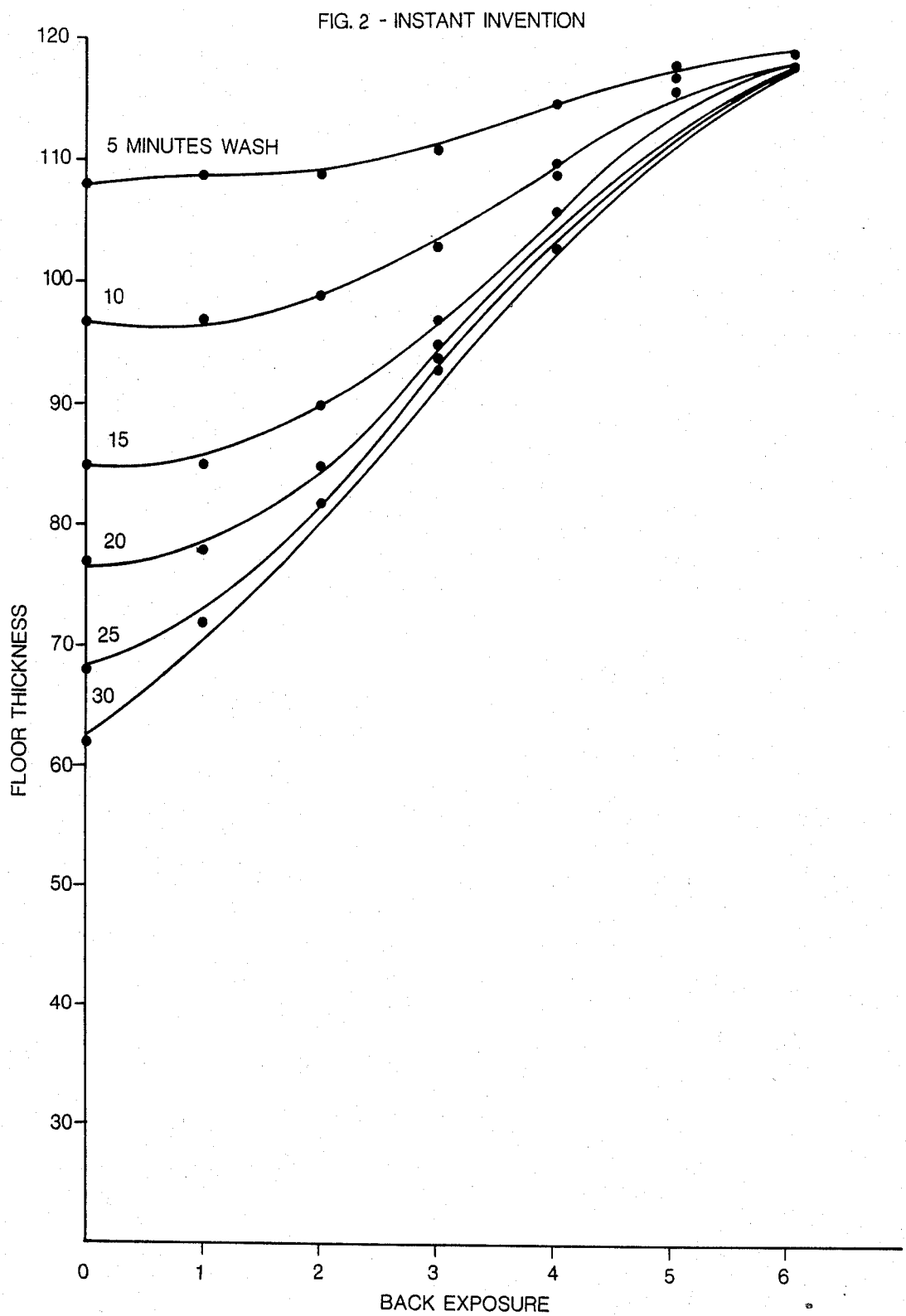

PHOTOSENSITIVE ELASTOMERIC POLYMER COMPOSITION FOR FLEXOGRAPHIC PRINTING PLATES - PROCESSABLE IN SEMI-AQUEOUS BASIC SOLUTION OR SOLVENT SYSTEMS

This is a continuation of application Ser. No. 413,581, filed Aug. 31, 1982, now abandoned.

FIELD OF THE INVENTION

This invention relates to high molecular weight butadiene/acrylonitrile copolymers containing carboxyl groups blended with high molecular weight butadiene/acrylonitrile copolymers without carboxyl groups to produce photosensitive elastomeric articles which are designed to be used primarily as a printing plate in a flexographic printing system.

The flexible photopolymer printing plates of the present invention can be rapidly processed in large amounts in semi-aqueous basic solutions. The printing plates are also processable in chlorinated hydrocarbon solution or blends of chlorinated hydrocarbons and alcohols. The plates also exhibit excellent solvent resistance to a wide variety of printing inks, especially water, alcohol, and hydrocarbon based inks. The compositions also exhibit excellent abrasion and ozone resistance as well as better photosensitivity than other photosensitive printing plates.

BACKGROUND OF THE INVENTION

British Pat. No. 1,358,062 discloses photosensitive compositions consisting of a nitrile rubber with an addition photopolymerizable tri or tetra-unsaturated ester derived from acrylic or methacrylic acid and an addition polymerization initiator activatable by actinic radiation. Plates made from these compositions are processable only via solvent wash out to produce soft flexible printing plates.

U.S Pat. No. 3,825,430 discloses a photosensitive composition containing a continuous phase of a light sensitive organic material and a discontinuous phase of a finely divided, elastomeric organic compound uniformly distributed through the continuous phase, i.e. a carboxyl containing, high molecular weight butadiene/acrylonitrile copolymer.

U.S. Pat. No. 4,177,074 discloses a photosensitive composition containing a high molecular weight butadiene/acrylonitrile copolymer which contains carboxyl groups and a low molecular weight butadiene polymer which may or may not contain carboxyl groups and an ethylenically unsaturated monomer, and a free-radical generating system. This composition has use as a flexographic printing plate but requires continuous replacement of the solvent during the washout (developing) stage.

U.S. Pat. No. 4,272,608 discloses photosensitive elastomeric compositions comprising a high molecular weight carboxylated butadiene/acrylonitrile copolymer in which at least 25% of the carboxyl groups are neutralized with a metal cation of Groups IIA or IIB of the periodic table and an ethylenically unsaturated monomer and a free radical generating system. This composition utility as a photosensitive flexographic printing plate but also has the disadvantage of requiring large quantities of wash solvent or solution during the washout stage.

SUMMARY OF THE INVENTION

The present invention is a flexible photopolymer printing plate comprising a homogenous blend of:

(1) about 40 to about 90% by weight of a high molecular weight butadiene/acrylonitrile copolymer having a number average molecular weight of about 30,000 to 125,000 an acrylonitrile content of 10 to 50% by weight, and a carboxyl content of 1 to 15% by weight, and (2) about 2 to about 60% by weight of a high molecular weight butadiene/acrylonitrile copolymer having a number average molecular weight of about 50,000 to 100,000, an acrylonitrile content of 10 to 50% by weight, and (3) a photopolymerizable, ethylenically unsaturated crosslinking agent compatible with polymers (1) and (2), and (4) an addition polymerization initiator activatable by actinic radiation.

These photosensitive, elastomeric compositions differ from and are advantageous over the prior art in that the homogenous blend of carboxylated and non-carboxylated high molecular weight butadiene/acrylonitrile copolymer does not effect the semi-aqueous processability of the carboxylated copolymer, it in fact extends the amount of polymer that can be processed by a given amount of semi-aqueous basic wash solution. This extended semi-aqueous washout (about 100% greater capacity) is accomplished by the spontaneous separation of the non-carboxylated polymer from the wash solution. This separated polymer can thus mechanically be removed from said semi-aqueous wash solution thus slowing the buildup of polymer in said semi-aqueous wash solution resulting in extended utilization of the solution.

An added feature of the homogenous blend of the non carboxylated high molecular weight copolymer and carboxylated high molecular weight copolymer is to render the composition processable in pure chlorinated solvent (specifically perchloroethylene). This is accomplished by controlling the acrylonitrile content of the non carboxylated copolymer to a range of 20 to 30%. This produces a blend processable in pure chlorinated solvent with extended washout produced by the spontaneous separation of either or both polymers from said solvent wash solvent. This separated polymer can thus mechanically be removed from said solvent wash solution thus slowing the buildup of polymer in said solvent wash solution resulting in extended utilization of the solvent. Prior art compositions using solvent or aqueous or semi-aqueous wash do not have extended wash systems and require large quantities of wash solvent or solution due to rapid buildup of polymer during washout.

This invention provides photosensitive materials for producing flexographic printing plates with the known industry advantages of speed, reduced costs, and labor savings over conventional platemaking procedures. The homogenous blends of high molecular weight carboxylated and non carboxylated copolymers also have improved ink compatability over prior art blends, due to the use of only high molecular weight copolymers. These compositions also show improved sensitometric properties (higher cure rate) requiring less exposure to actinic radiation to reproduce finely detailed images.

DESCRIPTION OF THE PREFERRED EMBODIMENTS OF THE INVENTION

High molecular weight copolymers of butadiene/acrylonitrile when formulated as described in British Pat. No. 1,358,062 (Uniroyal) and processed into photosensitive printing plates do not process in aqueous or semi-aqueous basic solution since they exhibit no solubility or softening in this type of aqueous wash solution. High molecular weight carboxyl butadiene/acrylonitrile copolymers mixed with low molecular weight butadiene polymers containing at least 2% by weight of carboxyl groups produce a photosensitive printing plate that is soluble in aqueous or semi-aqueous basic solutions before photopolymerization (U.S. Pat. No. 4,177,074). This composition produces a photosensitive printing plate that can be solvent processed. Compositions containing a continuous phase of a butadiene/acrylonitrile binder and a discontinuous phase of finely divided carboxyl containing high molecular weight butadiene/acrylonitrile copolymers have been used as a photosensitive composition (U.S. Pat. No. 3,825,430). Such discontinuous compositions do not lend themselves to photosensitive printing plate compositions.

The composition of this invention relates to key elements which provide the base composition for the photosensitive element. The first key element is a high molecular weight butadiene/acrylonitrile copolymer having a number average molecular weight in the range of 30,000 to 125,000 and preferably in the range of 90,000 to 110,000. The acrylonitrile content of these polymers can be from 10 to 50% and preferably from 20 to 40%. This copolymer must have carboxyl content of 1 to 15% preferably from 4 to 8%. This high molecular weight carboxylated copolymer should make up from about 40 to 90% by weight of the total composition and preferably about 55 to 65%. Physical properties of the composition are relatively independent of the percentage of the base polymers. The carboxyl content of this key element is based on values supplied by the manufacturers of the high molecular weight carboxylated butadiene/acrylonitrile copolymers (Polysar and B.F. Goodrich). Good flexibility and physical properties are obtained with the photosensitive composition, especially for application as flexographic printing plates.

Another key element of this photosensitive composition is a high molecular weight non-carboxlyated butadiene/acrylonitrile copolymer having a number average molecular weight in the range of 50,000 to 100,000 and preferably in the range of 55,000 to 85,000. The acrylonitrile content of these polymers can be from 10 to 30% and preferably from 20 to 30%. This copolymer should have no carboxyl content. This high molecular weight non carboxylated copolymer should make up from about 5 to 60% by weight of the total composition and preferably about 35 to 45%.

Proper selection of the above described polymers provides homogenous photosensitive compositions which are processable in pure chlorinated solvent with extended washout produced by the spontaneous and unexpected separation of either or both polymers from said wash solvent. The same compositions can also be processed in a semi-aqueous basic wash solution with extended washout. The extended washout is produced by the spontaneous and unexpected separation of the non carboxylated polymer from the semi-aqueous wash solution. By extended wash it is meant the processing of greater than normal quantities (square feet) of plate material. This is accomplished because the normal polymer buildup in the semi-aqueous wash media is slowed by the spontaneous separation of the polymer from the wash media. It is also accomplished by the use of fewer wash soluble materials in the composition.

Another key element of the photosensitive compositions are ethylenically unsaturated crosslinking agents. Photopolymerizable ethylenically unsaturated crosslinking agents suitable for use in the invention include unsaturated esters of polyols, particularly such esters with alpha-methylene carboxylic acids, e.g. ethylene glycol diacrylate, diethylene glycol diacrylate, glycerol diacrylate, glycerol triacrylate, mannitol polyacrylate, sorbitol polyacrylate, ethylene glycol dimethacrylate, 1,3 propanediol dimethacrylate, 1,3,4 butanetriol trimethacrylate, 1,4 butadediol diacrylate and dimethacrylate, 1,4-cyclohexanediol diacrylate, 1,4-benzenediol-dimethacrylate, isosorbidenediacrylate, pentaerythritol di-, tri- and tetra-methacrylate, dipentaerythritol polyacrylate, pentaerythritol di-, tri- and tetracrylates, 1,3 propanediol diacrylate, 1,6 hexanediol diacrylate and dimethacrylate, 1,5 pentanediol dimethacrylate, trimethylolpropane triacrylate, the bisacrylates and methacrylates of polyethylene glycols of molecular weight 200 to 4000, unsaturated amides, particularly those of the alpha-methylene carboxylic acids and especially those of alpha, omega-diamines and oxygen-interrupted omega-diamines such as methylene bisacrylamide, methylene bis-methacrylamide, ethylene bis-methacrylamide, 1,6 hexamethylene bis-acrylamide, diethylene triamine, tris-methacrylamide, 1,2-di (gamma-methacrylamidopropoxy) ethane, beta-methacrylamio-ethyl methacrylate, N-(beta-hydroxyethyl)-2-(methacrylamido) ethyl acrylate and N,N-bis (beta-methacryloxyethyl)acrylamide; vinyl esters such as divinyl succinate, divinyl adipate, divinyl phthalate, divinyl terephthalate, divinyl benzene-1,3-disulfonate, divinyl butane-1,4-disulfonate and unsaturated aldehydes, such as sorbaldehyde (hexadienal). An outstanding class of those preferred addition polymerizable crosslinking agents are the esters and amides of alpha-methylene carboxylic acids and substituted carboxylic acids with polyols and polyamines wherein the molecular chain between the hydroxyls and amino groups is solely carbon or oxygen-interrupted carbon.

The amount of unsaturated crosslinking agent added should be about 2 to about 40% by weight based on 100 parts of the elastomer content. The exact amount will vary for best results depending on the particular composition used. Preferably the amount of unsaturated compound is in the range of 5 to 25%.

The most preferred unsaturated crosslinking agents are 1,4 hexandeiol diacrylate, 1,4, hexanediol dimethacrylate, trimethylolpropane triacrylate and pentaerythritol triacrylate. The preferred compositions are those in which the high molecular weight copolymers with and without carboxylic acid are compatible with the unsaturated compounds to form clear, non light scattering compositions in thin layers less than 0.250" thick.

Another key element of the photosensitive composition is an addition polymerization and/or crosslinking initiator activatable by actinic radiation and thermally inactive at or below 185° C. Such initiators include aromatic ketones such as benzophenone and substituted benzophenones, the substituted or unsubstituted polynuclear quinones which are compounds having two intracyclic carbonyl groups attached to intracyclic carbon atoms in a conjugated six-membered carbocyclic ring, there being at least one aromatic carbocyclic ring fused to the ring containing the carbonyl groups. Suitable such initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzathraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone, alpha-sulfonic acid, 3-chloro-2-methylanthraquinone, retenequinone, 7,8,9,10-tetrahydronaphthacenequinone, and 1,2,3,4 tetrahydrobenz (a) anthracene-7,12-dione. Other photoinitiators which are also useful are described in U.S. Pat. No. 2,760,863 and include vicinal ketaldonyl compounds such as diacetyl benzil, etc., α-ketaldonyl alcohols, such as benzoin, pivaloin, etc. acyloin ethers, e.g. benzoin methyl and ethyl ethers, etc., α-hydrocarbon substituted aromatic acyloins, including α-methylbenzoin, α-allylbenzoin and α-phenylbenzoin and 2,2 dialkoxy-2-phenylacetophenone.

The amount of photoinitiator added should be 0.1 to 10% by weight based on 100 parts of the total elastomer, the preferred range being 1 to 4%.

The photosensitive composition can be prepared by mixing the four essential components, i.e. (1) the high molecular weight butadiene/acrylonitrile carboxyl containing copolymer, (2) the high molecular weight butadiene/acrylonitrile non carboxyl containing copolymer, (3) the compatible ethylenically unsaturated crosslinking agent, and (4) the free-radical generating system. Mixing to a homogenous single phase may be accomplished by solvent blending in suitable solvents such as chlorinated hydrocarbons e.g. trichloroethylene, trichloroethane and chlorotoluene, ketone, e.g. methyl ethyl ketone, diethyl ketone, and methylisobutyl ketone; aromatic hydrocarbons e.g. toluene and tetrahydrofuran. Mixing may also be accomplished by open milling or in an internal mixer for a time long enough to incorporate the ingredients homogeneously usually several minutes.

The homogenous, single phase non light scattering compositions are then formed into sheets in any desired manner of thickness from 0.0005" to 0.250". Such methods are, for example, solvent-casting, hot pressing, calendering or extrusion at room temperature or at elevated temperature. The sheet may be supported during forming by a suitable supporting substrate or the sheet may be applied to a supporting substrate after forming. The supporting substrate can be any natural or synthetic support which exists in a flexible or rigid film or sheet form. Commonly used supports for use of this composition in flexographic printing include metal sheets such as steel or tin coated steel and plastic films such as polyester or polyamide. The preferred supporting substrates are dimensionally stable and resistant to the washout solutions.

As these are photo activated systems, it is necessary to protect the above mentioned sheets from surface contamination by dirt and dust during storage before being exposed and washed into a finished relief imaged element. This is accomplished be lamination or application of a flexible protective cover sheet to the side of the element opposite that of the substrate. As these elements can be tacky, it is also desirable to apply a release film to the surface of the element before application of the protective cover sheet. This release film may consist of a thin 0.0002" thick flexible polymeric film such as a film of polyamide copolymer or vinyl acetate copolymer. Similarly familiar release agents may also be used for this purpose e.g. silicone, flurocarbons, waxes as long as they are transparent and do not interfere with exposure to actinic radiation. These release agents or films promote good intimate contact between the surface of the element opposite to the substrate and an image bearing negative or transparency applied to the element. This intimate contact is essential for accurate reproduction of the image on the element.

Relief printing plates are produced from the composition of this invention from the above described sheets. The construction consists of a polyester substrate from 0.001" to 0.020" and preferably 0.005" adhered to a sheet of the composition from 0.010" to 0.250" thick coated with a 0.0002" thick polyamide copolymer release film on the side opposite of the substrate. This polyamide film is covered and adhered to a second polyester film (0.005") which is a protective cover sheet. This construction is then exposed to actinic radiation thru the substrate, if necessary depending on thickness, to crosslink via addition polymerization the non relief backing area of the plate. This exposure will control the depth of relief produced in the plate. Thin plates do not require this step. The plate is then turned over and the protective cover sheet removed. Photographic negatives or transparencies or other image bearing media, with transparent and opaque areas used to produce the image, are laid in intimate contact with the polyamide release coated surface of the sheet of the composition of the invention. Good contact between the negative and release surface is provided by a vacuum system that presses the negative against the sheet surface. This sandwich is then exposed to actinic radiation, e.g. ultraviolet radiation at a wavelength between 2500° A and 5000° A, with preferred being 3600° A. On exposure the transparent areas of the negative permit addition polymerization or crosslinking to take place. Exposure is of sufficient duration to crosslink the image to the substrate or the previously crosskinked sheet backing. Crosslinking will occur only in the exposed areas of the sheet (transparent areas of the negative) with no significant crosslinking occurring in the non image unexposed areas of the sheet (opaque areas of the negative).

Actinic radiation may be provided from any source such as, carbon arcs and high pressure mercury lamps. Preferred sources are very high output blacklight fluorescent types due to their high ratio of ultraviolet to infrared output. Exposure times will vary, depending on the output of the lamps, distance from the lamp, the relief depth desired and the thickness of the plate. Exposure times may vary from a few seconds to several minutes.

On completion of the exposure the negative is removed and the exposed sheet is ready for development of the relief image by either of two preferred methods, solvent or semi-aqueous basic solution. These wash systems remove the unexposed, uncrosslinked composition from the exposed sheet and do not adversely affect the exposed, crosslinked composition that form the raised relief image.

Solvent wash may be accomplished as in prior art with organic solvents such as 2-butanone, benzene, toluene, xylene, trichloroethane, trichloroethylene, tetrachloroethylene, methyl chloroform, and solvent mixtures such as tetrachloroethylene/n-butanol.

Washout of this composition in organic solvent is unexpected especially in the chlorinated organic solvents, i.e. tetrachloroethylene, because the high molecular weight carboxylated copolymers are not soluble or softened by this solvent and hence do not wash out unless blended with solubilizing low molecular weight materials such as plasticizers, low molecular weight polymeric plasticizers or waxes used in the prior art. It is wholly unexpected that mixtures of the high molecular weight butadiene/acrylonitrile carboxylated copolymers can be rendered processable in tetrechloroethylene by the addition of a second high molecular weight non carboxylated butadiene/acrylonitrile copolymer at preferred levels of 35 to 45%. It is also wholly unexpected that the same composition that has been rendered processable in tetrachloroethylene has the same good processability in semi-aqueous basic solutions as described below. The composition of this invention has the added and unexpected property of extended washout using pure tetrachloroethylene, the preferred wash solvent, in a brushing assisted washout. The extended washout is produced by the wholly unexpected spontaneous separation of the high molecular weight carboxylated butadiene/acrylonitrile copolymer(s) from the solvent. The non carboxylated copolymer, depending on its acrylonitrile content and molecular weight, may or may not separate from the solvent. This spontaneous separation of the copolymer(s) from the tetrachloroethylene, on standing without agitation, permits the simple rapid mechanical removal of the washed polymer from the washout solvent and permits solvent reuse again and again without changing or recycling via filtering or distillation. The use of less tetrachloroethylene soluble material (plasticizer) also results in a slower contamination of the solvent and extended washout.

Without spontaneous separation of the copolymer(s) from the tetrachloroethylene, or the use of high plasticizer levels, only 150–175 square foot of sheet material can be processed with 30 gallons of tetrachloroethylene to 0.035" relief with a 50% image area before the polymer and plasticizer in the solvent redeposits on the washed plates to such an amount that poor print quality resulted. The poor quality would be evident by fill in of the counter areas of normal print, e.g. the center relief area of letters such as "o", "a" and "e" and the fill in of shadow areas of half tone printing. At this point the tetrachloroethylene would have to be changed to fresh tetrachloroethylene. The tetrachloroethylene containing the copolymer and plasticizer would then have to be disposed of at considerable expense or the polymer and plasticizer removed by distillation and the solvent reused. All of these methods are expensive and time consuming.

With spontaneous separation of the copolymer(s) from the tetrachloroethylene over 300 square foot of sheet material can be processed with 30 gallons of tetrachloroethylene to a relief of 0.035" with a 50% image area. This increase or extended solvent use provides considerable savings thru reduced solvent use and solvent handling.

The composition of this invention may also be washed as in the prior art via suitable water based solutions that include aqueous base to which a watersoluble organic solvent may be added. Suitable specific washout mixtures include sodium hydroxide/isopropyl alcohol/water, sodium carbonate/2-butoxyethanol/water, sodium borate/2-butoxyethanol/water, sodium silicate/-2-butoxyethanol/glycerol/water, sodium carbonate/2-(2-butoxyethoxy) ethanol/water, sodium hydroxide/2-(2-butoxyethoxy)ethanol/water and sodium hydroxide/1,2 ethanediol/water. Normal use of these solutions is at elevated temperature. The preferred solution is sodium hydroxide/2-(2-butoxyethoxy) ethanol/water (0.5% sodium hydroxide in water/2-(2-butoxyethoxy)ethanol (5/1 ratio by volume) at 140° to 150° F. Prior art compositions provide limited wash solution usage without the unexpected spontaneous separation of the non carboxylated copolymer of the composition of this invention.

Without spontaneous separation of copolymer from wash solution only 40–50 square feet of sheet material can be processed to 0.035" relief with a 50% image area using 30 gallons of the sodium hydroxide/2-(2-butoxyethoxy)ethanol/water solution cited as preferred above. At this point wash rates become so slow as to be impractical, and the wash solution must be replaced because of the high level of polymer in the solution. This requirement is time consuming and costly.

With spontaneous separation of the non carboxylated copolymer from the solution over 150 square feet of sheet material can be processed with 30 gallons of the sodium hydroxide/2-(2-butoxyethoxy)ethanol/water solution cited as preferred above, to 0.35" relief with 50% image area. This increase or extended solution use provides considerable savings thru reduced solvent use and solvent handling.

The above composition has preferred utility in raised image printing processes such as letterpress, letterset and flexographic printing, however, the compositions also have utility in other applications where image formation is utilized such as photoresists, planographic plates, "silk screen" printing and stenoils.

The following examples illustrate the invention.

EXAMPLE 1

A formulation containing 161.5 grams Krynac 211 [trademark] a high molecular weight butadiene/acrylonitrile copolymer (number average molecular weight 100,000; acrylonitrile content 31–34%, carboxyl content 9% as reported by the manufacturer), 108.2 grams Paracril BP [trademark], a high molecular weight butadiene acrylonitrile copolymer (number average molecular weight 70,000, acrylonitrile content 29.5%, carboxyl content 0.0%), 27.0 grams trimethylolpropane triacrylate (TMPTA) and 2.7 grams of 2,2-dimethoxy-2-phenylacetophenone (DMPAP) was prepared by dissolving the ingredients in a blend of 456.5 grams of toluene and 152.2 grams of methyl ethyl ketone. The homogenous solvent mixture was then cast on a support sheet of polyester film (0.005"), via a doctor blade, in multiple passes to build the photosensitive composition to a dry film thickness of 0.075". The doctor blade was set 0.006" over the polyester substrate or support film at the start of the casting and adjusted to 0.006" over the cast material as the thickness was built to 0.075". Each additional pass was air dried for 5 minutes at 70°–80° F. and then oven dried at 130°–150° F. for 5 minutes before the next pass was applied. When the desired 0.075" gauge was reached, the plate was then oven dried at 130°–150° F. for 6 hours to remove any remaining solvent.

The plate was then sprayed with a dry release high molecular weight wax coating on the side opposite the polyester support sheet. The plate was then exposed on the back, thru the polyester support, for 45 seconds with a bank of 21 ultraviolet lamps (Sylvania [trademark] blacklight very high output lamps, FR-48T12 - B/L-VHO-180) using a Flex-Ligh ® [trademark] exposure unit Model 4821. The lamps were spaced apart on 2" centers. The plate was placed 2" from the lamps. After back exposure, the plate was placed face up (polyester backing down) under the lamps. A ByChrome percentage-calibrated screen tint negative was placed in intimated contact with the release coated surface using the vacuum frame of the exposure unit. The plate was exposed thru the negative to the ultraviolet light for 10 minutes. After exposure the negative was removed and the plate was washed for 20 minutes in a 1442 Flex-Light ® rotary brush processor using pure tetrachloroethylene. After washing, the plate was dried in a forced air oven at 150° F. for 1 hours. The resulting plate had a relief image of 0.30" (with a wash rate of 0.0015"/min). The image sharpness was excellent. The plate reproduced the 5 to 90% tones in the negative from 65 line to 150 line half tone. This indicates excellent tone reproduction. Plate hardness was 50 Shore A and the plate did not crack when flexed 180° upon itself.

EXAMPLES 2 and 3

Two control plates were prepared as in Example 1 with the following compositions:

| Example 2 | Example 3 |
| --- | --- |
| 269.7 grams Krynac 211 | 269.7 Grams Paracril BP |
| 27.0 grams TMPTA | 27.0 grams TMPTA |
| 2.7 grams DMPAP | 2.7 grams DMPAP |
| 465 grams Toluene | 465.5 grams Toluene |
| 152 grams methyl ethyl Ketone | 152.2 grams methyl ethyl Ketone |

The plates were cast and dried as in Example 1. The two samples were then exposed and washed and dried as in Example 1. The resulting reliefs were 0.002" for Example 2 and 0.030" for Example 3. This result shows that the carboxylated high molecular weight copolymer alone (Example 2) has a very low wash rate, in tetrachloroethylene (0.0001"/minute) and that the non carboxylated high molecular weight copolymer alone (Example 3) has a much higher wash rate (0.0015"/minute). This result illustrates the unexpected result that the composition of Example 1 shows the same wash rate (0.0015"/minute) as the non carboxylated high molecular weight copolymer. What would ordinarily be expected by someone skilled in the art would be a wash rate somewhere in between the wash rate of the carboxylated and non carboxylated high molecular weight copolymers when washed in pure tetrachloroethylene solvent. The control plates had Shore A hardnesses of 50-52 and the plate of Example 3 good image resolution.

EXAMPLE 4

This example illustrates the use of a non carboxylated low acrylonitrile content butadiene acrylonitrile copolymer. A blend containing 175.3 grams Krynac 211, 94.4 grams non carboxylated Paracril 1880LM high molecular weight butadiene/acrylonitrile copolymer number average molecular weight acrylonitrile content 22.0%) 27.0 grams 1,6 hexanediodiacrylate 2.7 grams DMPAP was prepared by mixing the ingredients on a two roll mill at 200° F. for 30 minutes. The mix was then compression molded into a 6×6×0.070" plate with a 0.005" polyester support on one face and a silicone release on the opposite face. The plate was then exposed as in Example 1 for 1 minute on the back thru the polyester support and for 14 minutes on the face thru a line process negative. The plate was then washed in pure tetrachloroethylene and dried as in Example 1. The resulting plate had a relief of 0.023", a Shore A durometer of 55 with good image resolution.

EXAMPLE 5

This example illustrates the use of a non carboxylated high acrylonitrile content butadiene/acrylonitrile copolymer. A blend containing 175.3 grams Krynac 211, 94.4 grams non carboxylated Paracril CJLT (Paracril CJLT high molecular weight butadiene/acrylonitrile copolymer, number average molecular weight 82,000, acrylonitrile content 39.5%) copolymer, 27.0 grams TMPTA, and 27 grams DMPAP was prepared as in Example 1. The plate was then exposed as in Example 1 for one minute on the back and for 10 minutes on the face thru a line process negative. The plate was then washed in pure perchloroethylene and dried as in Example 1. The resulting plate had no relief and a Shore A durometer of 58. This result illustrates that only medium to low acrylonitrile copolymers (20-30% acrylonitrile) can be blended to give the desired tetrachloroethylene washability.

EXAMPLE 6

A sample was prepared and exposed as in Example 1 and washout was accomplished in the same type of wash unit as in Example 1 but using a solution of 0.5% sodium hydroxide in 2-(2-butoxyethoxy)ethanol/water (¾ by volume) at a temperature of 145° F. Brush out time was again 20 minutes followed by a drying time of 1 hour in a forced air oven at 150° F. Relief of the resulting plate was 0.045 (0.0022"/minute). Image resolution and Shore A were equivalent to the plate of Example 1.

EXAMPLES 7 and 8

Plates were prepared as in Examples 2 and 3 and exposed as in Example 1. Washout was then carried out as described in Example 6. The resulting relief was 0.046" (0.0024"/minute) for (Example 7) the Krynac 211 based carboxylated copolymer plate. The Krynac 211 plate had a Shore A durometer of 52 and good image resolution and flexibility. The Paracril BP plate (Example 8) when washed as described in Example 6 produced a relief of 0.002" (0.001"/min) a very slow washrate. This result illustrates the unexpected result that the composition of Example 6 shows the same wash rate (0.0023"/minute) as the carboxylated high molecular weight copolymer. What would ordinarily be expected by someone familiar with compounding would be a wash rate somewhere in between the wash rate of the carboxylated (Example 7) and non carboxylated (Example 8) high molecular weight copolymers when washed in semi-aqueous solution.

EXAMPLE 9

Following the general procedures of Examples 1 and 6 the following composition was prepared by solution blending:
65 parts Hycar 1072 CG[(1)]
35 parts of Paracril BP
5 parts of 1,6hexanedioldiacrylate
5 parts of 1,6hexanedioldimethacrylate
1 part of DMPAP (1) Hycar 1072 CG [trademark] is a high molecular weight butadiene/acrylonitrile copolymer with a number average molecular weight of 30,000, acrylonitrile content 27%, carboxyl content 3.4%.

The composition was made into a sheet plate as described in Example 1. Exposure and washout (in tetrachloroethylene) as described in Example 1 produced a plate with 0.035" relief (wash rate =0.0018"/min), a Shore A durometer of 48 and good image resolution and no cracking when flexed 180°. A second plate of the same composition was also exposed and washed (in semi-aqueous solution) as described in Example 6. This produced a plate with 0.040" relief (wash rate =0.0020"/min) and a Shore A durometer of 48 with good image resolution as the same plate in tetrachloroethylene.

EXAMPLE 10

This example illustrates the extended washout of the instant invention in tetrachloroethylene wash solvent as compared to a composition made according to U.S. Pat. No. 4,177,074.

A plate was prepared as in Example 1, but to a gauge of 0.125" thick. Another plate was prepared by the method of Example 1 with a formulation containing 130.0 grams Hycar 1072 CG, 40.0 grams of Hycar CTBNX, a low molecular weight butadiene/acrylonitrile copolymer (B.F. Goodrich, Inc. number average molecular weight 3400, acrylonitrile content 21.8%, carboxyl content 3.24% as reported by the manufacturer), 26.0 grams of triethylene glycol diacrylate and 4.0 grams of benzoin isobutyl ether (from U.S. Pat. No. 4,177,074).

Both plates were exposed as described in Example 1 using a line process negative. Each place was then washed separately in 1000 cc of pure tetrachloroethylene using a Hobart mixer (model A-200) converted to an orbital type brush processor. A 6"×6"×0.125" plate of each composition was washed to produce 0.030" of relief. This procedure was repeated 2 times with the same 1000 cc of tetrachloroethylene. The washout solvent was then poured into a 2 quart mason jar and allowed to separate undisturbed for 15 hours. After this time, samples of the used tetrachloroethylene from each composition were taken by syringe from the bottom of each jar. Percent solids of each sample were then taken. The used tetrachloroethylene from the composition from Example 1 had a percent solids of 0.6%. The used tetrachloroethylene from the material from the composition of U.S. Pat. No. 4,177,074 had a percent solids of 1.2%. This indicates that approximately twice as much more material from the composition of the instant invention could be processed as that from the composition of U.S. Pat. No. 4,177,074 due to polymer separation and because no tetrachloroethylene soluble plasticizers are used in the present invention.

EXAMPLE 11

This example illustrates the extended washout of the instant invention in semi-aqueous wash solvent as compared to a composition made according to U.S. Pat. No. 4,177,074. Plates were again prepared and exposed as in Example 10. Washout was again accomplished in the converted Hobart (Model A-200). Wash solution was with 1000 cc of a solution containing 0.5% sodium hydroxide in 2-(2-butoxyethoxy) ethanol/water (¼ by volume) at a temperature of 145° F.A. 6"×6"×0.125" plate of each composition was washed separately to produce 0.030" of relief. The washout solution was then poured into a 2 quart mason jar and allowed to separate, undisturbed for 15 hours. After this time, samples of the used semi-aqueous wash solution from each composition were taken by syringe from the bottom of each jar. Percent solids of each sample were then taken. The used semi-aqueous wash solution from the composition from Example 1 had a net percent solids of 11%. The used semi-aqueous wash solution from the composition of U.S. Pat. No. 4,177,074 had a net percent solids of 3.1%. This indicates that approximately three times as much more material from the composition of the instant invention could be processed as that from the composition of U.S. Pat. No. 4,177,074 due to polymer separation.

EXAMPLE 12

This example shows the improved ink compatibility of the composition of this invention as compared to a composition made according to U.S. Pat. No. 4,177,074. Samples of plates prepared as described in Example 10 were exposed as in Example 10 but without a negative to produce a fully cured sample. The cured samples of each composition were then soaked for 4 hours and 24 hours in pure denatured ethyl alcohol. Shore A durometer hardnesses were measured at the beginning and at each of the test times. Results are shows in Table I.

TABLE I

| Composition | Initial Shore A | Shore A after 4 hrs. | Shore A after 24 hrs. |
|---|---|---|---|
| Example 1 | 55 | 50 | 50 |
| U.S. Pat. No. 4,177,074 | 55 | 50 | 44 |

The continuous 10 point drop in the Shore A hardness of the composition of U.S. Pat. No. 4,177,074 indicates poorer resistance to the denatured ethyl alcohol versus the 5 point drop of the present composition (Example 1). Ethyl alcohol based inks are widely used in the flexographic printing process.

EXAMPLE 13

This example illustrates the higher cure rate of the instant invention as compared to a composition made according to U.S. Pat. No. 4,177,074. Samples of plates prepared as qescribed in Example 10 were back exposed as described in Example 1. Back exposure times were from 0 to 6 minutes in 1 minute increments. The back exposed samples were washed in a unit as described in Example 6.

The samples were washed for 5 minutes, dried 5 minutes at 150° F. in a forced air oven and each back exposure time gauged for relief. After gauging, the samples were washed an additional 5 minutes, dried, and gauged. This process of 5 minutes wash, drying and gauging was repeated until 6–5-minute wash cycles were completed. The data for each composition was then plotted as shown in FIGS. I and II attached.

From this plot an average cure rate/minute of back exposure may be determined from the average slope of the lines formed by connecting the cured floor relief for each back exposure. This method yields a cure rate of approximately 0.010"/minute of back exposure for the composition of Example 1 versus a cure rate of approximately 0.005"/minute for the composition of U.S. Pat. No. 4,177,074.

What we claim and desire to protect by Letters Patent is:

1. A homogeneous elastomeric photosensitive composition suitable for inclusion in a flexographic printing plate consisting essentially of:
   (A) 40 to 90% by weight of the total composition of a high molecular weight butadiene/acrylonitrile carboxylated copolymer having a number average molecular weight of 30,000 to 125,000, an acrylonitrile content of 10 to 50%, and a carboxyl content of 1% to 15% by weight.
   (B) 5 to 60% by weight of the total composition of a high molecular weight butadiene/acrylonitrile noncarboxylated copolymer having a number average molecular weight of 50,000 to 100,000, an acrylonitrile content of 10 to 30% so that the combination of the carboxylated and noncarboxylated high molecular weight copolymers give a composition with a carboxyl content of 3 to 10%.
   (C) 2 to 40% by weight of the total composition of an addition photopolymerizable ethylenically unsaturated monomer and
   (D) 0.1 to 10% by weight of the total composition of a photoinitiator activatable by actinic radiation.

2. The elastomeric photosensitive composition defined in claim 1 wherein the high molecular weight carboxylated copolymer and the high molecular weight noncarboxylated copolymer when combined have an average carboxyl content of 4 to 8%.

3. The elastomeric photosensitive composition defined in claim 1 where the high molecular weight carboxylated copolymer is present in the amount of 55 to 65% and the noncarboxylated copolymer is present in the amount of 35 to 45%.

4. The elastomeric photosensitive composition defined in claim 3 when the carboxylated high molecular weight copolymer has a number average molecular weight of 90,000 to 110,000 and the acrylonitrile content is 20 to 40%.

5. The elastomeric photosensitive composition defined in claim 4 where the carboxylated high molecular weight copolymer has a carboxyl content of 4 to 10%.

6. The elastomeric photosensitive composition defined in claim 3 where the non carboxylated high molecular weight copolymer has a number average molecular weight of 55,000 to 85,000 and the acrylonitrile content is 20 to 30%.

7. The elastomeric photosensitive composition defined in claim 2 where the carboxylated high molecular weight copolymer is present in the amount of 55 to 65%, and has a molecular weight of 90,000 to 110,000 and an acrylonitrile content of 20 to 40% and the non carboxylated high molecular weight copolymer is present in the amount of 35 to 45% and has a molecular weight of 55,000 to 85,000 and an acrylonitrile content of 20 to 30%.

* * * * *